United States Patent [19]

Brinegar

[11] 4,021,730
[45] May 3, 1977

[54] ELECTRICAL CONDUCTOR AND SHORT CIRCUIT LOCATOR

[76] Inventor: Paul E. Brinegar, 5904 SW. 21st., Lt. No. 17, Oklahoma City, Okla. 73128

[22] Filed: Feb. 21, 1975

[21] Appl. No.: 551,816

[52] U.S. Cl. .............................. 324/52; 307/132 E; 324/67; 331/111

[51] Int. Cl.² ...................................... G01R 31/08

[58] Field of Search ....................... 324/51, 52, 67; 307/132 R, 132 E; 331/111; 315/200 A

[56] References Cited

UNITED STATES PATENTS

| | | | |
|---|---|---|---|
| 2,127,216 | 8/1938 | Hallden et al. | 324/52 |
| 2,641,633 | 6/1953 | Hosford | 324/52 |
| 2,887,592 | 5/1959 | Stout et al. | 315/200 A |
| 2,969,486 | 1/1961 | Amfahr | 315/200 A |
| 3,281,611 | 10/1966 | Leeder | 307/132 E |
| 3,382,405 | 5/1968 | Johnson | 331/111 X |
| 3,446,992 | 5/1969 | Webb | 331/111 X |
| 3,493,813 | 2/1970 | Seidler | 331/111 UX |
| 3,562,599 | 2/1971 | Dreitzler | 307/132 X |
| 3,621,384 | 11/1971 | Yamada | 324/52 |
| 3,858,063 | 12/1974 | Saleme | 331/111 X |

Primary Examiner—Gerard R. Strecker
Attorney, Agent, or Firm—Wofford, Felsman, Fails & Zobal

[57] ABSTRACT

Apparatus for locating a conductor or a short circuit in the wiring of a AC or DC circuit is disclosed. The apparatus is portable and useful in the troubleshooting of complex control systems or the like with the aid of a clamp-on ammeter. Typically, the apparatus is connected in the fuse circuit to be tested, and a pulsating current of low pulse rate is supplied by a solid-state relaxation oscillator which opens and closes a relay bridging the fuse terminals or other convenient circuit point. Where the fuse circuit to be tested is a DC circuit and both AC and DC circuits are in a common conductor bundle, a separate astable multivibrator acts to supply a higher frequency pulsating current superimposed on the low pulse rate pulsating current. The location of a particular conductor or a short circuit is then easily found with the aid of a clamp-on ammeter.

4 Claims, 2 Drawing Figures

ELECTRICAL CONDUCTOR AND SHORT CIRCUIT LOCATOR

BACKGROUND OF THE INVENTION

1. Field of the Invention

The present invention relates generally to a troubleshooting apparatus useful for tracing electrical conductors in cables or locating short circuits in such cables, and more particularly, to an apparatus designed to be connected in the fuse circuit or other convenient circuit point in the circuit to be tested and used with an ammeter probe of the clamp-on type to trace electrical conductors and locate short circuits by detecting a pulsating current generated by the test apparatus.

2. Description of the Prior Art

In the control systems and data processing industries especially and in all industries which produce or employ machines having electrical wiring which varies from the relatively simple to the complex, there exists the need to be able to quickly trouble-shoot the electrical circuitry of those machines both during the production and maintenance of the machines. Typical of the circuits which require quick and efficient troubleshooting are automotive circuits which are low voltage DC, control systems circuits which may be both low voltage AC and DC circuits, and power distribution circuits which may be either or both high voltage AC or DC circuits. For example, in the production of a large scale data processing machine, it is often necessary to trace electrical conductors in large and multiply branched cables. Moreover, when production equipment goes down as a result of a short circuit, expensive down time can be incurred by the user of that equipment.

In order to facilitate the tracing of an electrical conductor or the location of a short circuit, testing devices have been devised which supply a pulsating current to the circuit being tested. One example of such a device is disclosed in U.S. Pat. No. 3,623,142. This patent describes a cable locator including a cam-operated switch means for impressing a pulsing current on the conductor. A synchronous motor is used to drive a cam member which in turn operates a make and break switch to impress a pulsing current of known amplitude to the conductor which is then subsequently identified by a clamp-on ammeter. While the concept is good, the implementation as described in the patent has several disadvantages. First, it requires a separate power supply to supply the pulsating current thereby limiting its use to the availability of an AC receptacle. Second, it is not useable for both low voltage and high voltage circuits. Third, it cannot be readily applied to both AC and DC circuits of a wide range of voltages. This lack of versatility is a considerable drawback when troubleshooting a variety of electrical circuits. Moreover, adequate circuit protection has not been provided for the testing of a variety of circuits.

Another example of a short locating device known in the prior art is disclosed in U.S. Pat. No. 3,621,384. This patent discloses a means for locating an intermittent DC short circuit by placing a transducer in parallel with the fuse. A search coil is used to provide an audio indication via earphones or the like. This system, however, has several disadvantages. First, it will not function on both AC and DC circuits. Second, the polarity cannot be reversed. Third, this system requires a transducer unit and a searching unit both of which require complex electronic circuitry.

SUMMARY OF THE INVENTION

It is therefore an object of the present invention to provide a portable apparatus for the tracing of electrical conductors and the locating of short circuits in a variety of circuits from relatively high voltages to relatively low voltages in both AC and DC.

It is another object of the invention to provide a troubleshooting apparatus having circuit protection to protect damage to either the troubleshooting apparatus or the circuit under test even if the test leads are reversed.

It is a further object of the invention to provide an apparatus for locating short circuits which may be operated by one man without the necessity of understanding or being familiar with the particular system that is being checked.

It is yet another object of the invention to provide a short circuit troubleshooting device which is readily adaptable to both positive and negative DC voltages, that is D.C. voltages that are either above or below ground potential.

The foregoing and other ojects are attained by providing an apparatus which has a pair of test leads adapted to be connected across the fuse terminals or other convenient circuit point of the circuit to be checked. These test leads are connected by a double pull, double throw switch to one of two circuits, one of the circuits being used for AC testing and the other being used for DC testing. Both circuits include relay contacts and current limiting resistors. A solid-state relaxation oscillator, the period of oscillation of which can be varied, periodically energizes the relay coil to open and close the relay contacts bridging the fuse terminals thereby providing a pulsating current of low pulse rate to the circuit being tested. In the case where the circuit being tested is a DC circuit, a solid-state switching circuit is connected in series with the relay contacts and the current limiting resistors. This solid-state switching circuit is controlled by an a stable multivibrator, the frequency of which can also be controlled. The frequency of the a stable multivibrator is higher than that of the relaxation oscillator and controls of the solid-state switching circuit to superimpose a higher frequency pulsating current on the lower frequency current pulsations caused by the opening and closing of the relay contacts. The solid-state switch will operate irrespective of the polarities of the terminals to which the test leads are connected. In addition, both the AC and DC circuits are separately fused.

BRIEF DESCRIPTION OF THE DRAWING

The specific nature of the invention, as well as other objects, aspects, uses and advantages thereof, will clearly appear from the following description and from the accompanying drawing, in which.

DESCRIPTION OF THE PREFERRED EMBODIMENT

The present invention is designed to be used in conjunction with an ammeter probe of the clamp-on type. Such a probe can be used around a single conductor or multiple conductors and will read the total current passing through its jaws whether it is carried by one conductor or one hundred conductors. A basic principle underlying the use of the present invention for locating short circuits is that the total current or very close to the total current will go to ground potential in both the AC and DC circuit. Thus, at the point in the electrical circuit or cable where the short circuit is located, the pulsating current generated by the apparatus according to the invention will no longer be detected by the ammeter probe.

Figure 1:
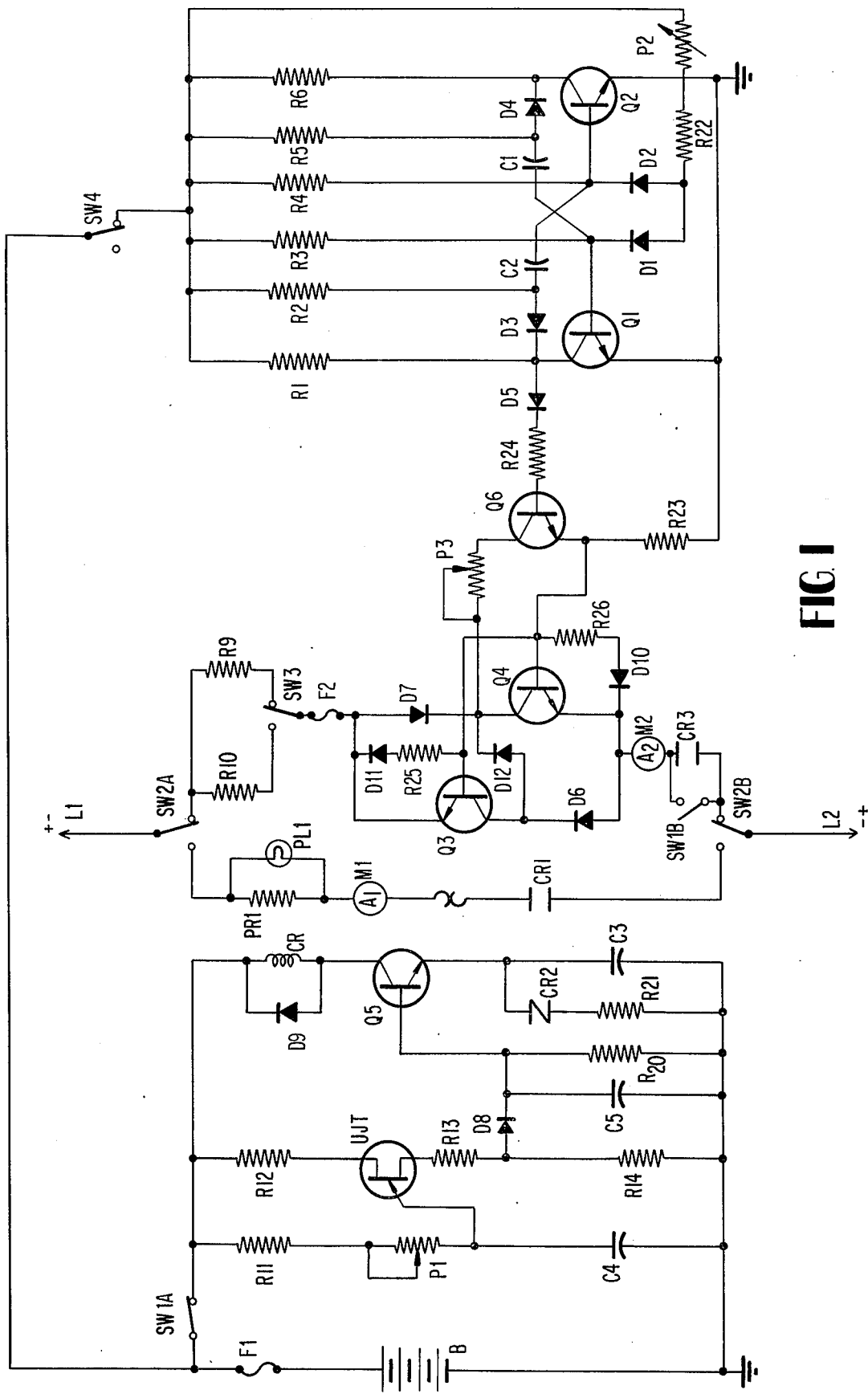
FIG. 1 is a schematic diagram of the testing apparatus according to the preferred embodiment of the invention.

Referring now to FIG. 1 of the drawing, the test leads L1 and L2 are adapted to be connected across open circuit breaker means such as a vacant fuse holder, across the tripped circuit breaker or other convenient point in the circuit to be tested. Assuming first that the double pole, double throw switch constituted by switches SW2A and SW2B are switched to the AC position, a circuit is completed between the test lead L1 and the test lead L2 which comprises a series limiting resistance PR1 which may be fixed or adjustable, an AC ammeter A1, a circuit breaker CB, and relay contacts CR1. The relay contacts CR1 may be either normally opened or normally closed, the choice being up to the operator since the device will function using either. However, since the relay coil CR is only momentarily energized, it is preferred to use normally open contacts in order to minimize the power dissipation across the series limiting resistance PR1. This allows the use of relatively low power rating-resistors and little heat dissipation within the unit. The purpose of the limiting resistance PR1 is to limit the current in the circuit being tested to between two and three amperes, and this may be adjusted by varying the resistance of limiting resistance PR1 and measuring on AC ammeter A1. The relay contacts CR1 are intermittently opened and closed to apply a pulsating current to the circuit under test.

The opening and closing of the relay contacts CR1 is controlled by a relaxation oscillator comprising a unijunction transsitor UJT having one of its base electrodes connected through resistor R12, switch SW1A of another double pole, double throw switch, and fuse F1 to the positive terminal of a battery B. The other base electrode of the unijunction transistor UJT is connected through series connected resistances R13 and R14 to circuit ground or the negative of battery B. A timing capacitor C4 is connected through the emitter of the unijunction transistor UJT and circuit ground and is charged through the series connected resistor R11 and potentiometer P1. The potentiometer P1 is connected as a variable resistance and controls the frequency of the relaxation oscillator and hence the time between openings and closings of the relay contacts CR1 as will hereinafter be more fully explained.

When power from the battery B is applied to the oscillator circuit through the fuse F1, the switch SW1A and resistor R11, the capacitor C4 begins to charge through potentiometer P1. When the charge on capacitor C4 reaches the threshold voltage of the emitter of the unijunction transistor UJT, the unijunction transistor conducts causing a current to flow through resistors R13 and R14 producing a voltage drop across each. When capacitor C4 has discharged through the unijunction transistor UJT, the cycle begins again.

The voltage drop across resistor R14 is coupled through diode D8 and charges capacitor C5 thereby putting a positive voltage on the base of NPN transistor Q5. A resistor R20 is connected in shunt with capacitor C5 between the base of the NPN transistor Q5 and circuit ground. The emitter circuit of transistor Q5 comprises a capacitor C3 connected between the emitter and circuit ground and the series connection of relay contacts CR2 and resistor R21 also connected between the emitter and circuit ground. The collector circuit of transistor Q5 comprises the relay coil CR connected between the collector and the contact of switch SW1A. A diode D9 is connected in shunt with the relay coil CR. The cathode of D9 is connected to switch SW1A and the anode of D9 is connected to the junction between the collector of Q5 and relay coil CR.

When a positive voltage is applied to the base of NPN transistor Q5, it is biased into conduction thereby energizing the relay coil CR and closing relay contacts CR1 (assuming these contacts are normally open) and opening normally closed relay contacts CR2. Emitter capacitor C3, having a relatively large value of capacitance, charges through the relay coil CR, and when it reaches full charge, current ceases to flow through the relay coil CR. The relay then drops out, opening relay contacts CR1 and closing relay contacts CR2. Capacitor C3 then discharges through the normally closed relay contacts CR2 and resistor R21 which has a relatively low value of resistance. Base resistor R20 has a relatively high value and prevents capacitor C5 from discharging too quickly. The cycle is repeated continuously at a time interval established by the time constant of the combination of resistor R11 and potentiometer P1 and capacitor C4.

As shown in the drawing, a pilot light PL is connected in parallel with the limiting resistor PR1. This pilot light merely serves as an indicator and may be omitted if desired. The diode D9 is commutating diode and serves to collapse the counter EMF of the relay coil CR.

With the pulse generating means or circuit thus far described, a variable timed current pulsation is provided to an AC circuit under test, the time period being adjustable by the potentiometer P1. The pulses representing the on-duration of the circuit are momentary, while the off-duration between pulses is longer, for example 5 seconds. This signal can be easily traced with the clamp-on ammeter probe through wiring harnesses, conduit boxes annd inevitably to the place where a short circuit is located simply by clamping the ammeter probe around many conductors in search of the conductor carrying the total pulsating current to ground and, finally, down to a single conductor which is shorted. This approach to short circuit location is very effective and accurate. Obviously, a similar procedure is used for tracing circuits, that is locating a single conductor in a multiconductor cable.

Now considering the DC testing circuitry, assume that switches SW2A and SW2B are switched to the DC position. In this position, test lead L1 is connected to two resistors R9 and R10. These resistors are current limiting resistors like resistor PR1. Resistors R9 and R10 have different values and are used in conjunction with switch SW3 to select the desired range. Those skilled in the art will recognize that a bank of such resistors can be provided with a multicontact switch to provide a choice of a plurality of ranges. In the alternative, one or more variable resistors could be used for the same purpose.

Switch SW3 is connected through a fuse F2 to a solid-state switching circuit. This solid-state switching circuit comprises two NPN transistors Q3 and Q4 connected in a complimentary manner to allow switching of the polarity of the test leads L1 and L2 without interferring with the DC circuit operation. More specifically, the emitter of transistor Q3 is connected to the fuse F2, while the collector of transistor Q3 is connected through diode D6 and to a DC ammeter A2. This provides a conduction path for currents flowing from a positive polarity at lead L2 to a negative polarity at lead L1. In parallel with this circuit, a diode D7 is connected between the fuse F2 and the collector of transistor Q4, and the emitter of transistor Q4 is connected to the ammeter A2. This provides a conduction path for currents flowing from a positive polarity at lead L1 to a negative polarity at lead L2. Base bias for transistor Q3 is provided by diode D11 and resistor R25 connected in series between the base and the emitter of transistor Q3. In a similar manner, base biasing is provided for transistor Q4 by diode D10 and resistor R26 connected in series between the base and emitter of transistor Q4. To provide voltage protection for transistors Q3 and Q4, Zener diodes may be connected between the bases and emitters of those transistors is desired.

To complete the circuit between the test leads L1 and L2, relay contacts CR3 are connected between the DC ammeter A2 and switch SW2B connected to lead L2. Relay contacts CR3 are also controlled by relay coil CR and, again, relay contacts CR3 may be either normally opened or normally closed. A switch SW1B is connected across relay contacts CR3 to permit shorting these contacts in the case where only DC is present in a conductor bundle containing the circuit to be tested.

The solid-state switching circuit comprising transistors Q3 and Q4 is controlled by an a stable multivibrator. This multivibrator comprises two NPN transistors Q1 and Q2 having their emitters connected to circuit ground. The collectors and bases of transistors Q1 and Q2 are cross coupled by diode D3 and capacitor C2 and diode D4 and capacitor C1, respectively. The collectors of Q1 and Q2 are connected through resistors R1 and R6 to a contact switch SW4. The junction between diode D3 and capacitor C2 and the junction between diode D4 and the capacitor C1 are also connected through resistors R2 and R5 to the switch contact of switch SW4, and the bases of transistors Q1 and Q2 are connected to the contact of switch SW4 through resistors R3 and R4. Switch SW4 is connected to the positive terminal of battery B through fuse F1.

Triggering diodes D1 and D2 have their cathodes connected respectively to the bases of transistors Q1 and Q2. The anodes of diodes D1 and D2 are connected in common to a resistor R22. Resistor R22 is connected in series with a potentiometer P2 to the contact of switch SW4. By adjusting potentiometer P2, the frequency of the a stable multivibrator can be varied from, for example, 140 Hz to 1400 Hz. This contrasts with timing intervals produced by the unijunction transistor relaxation oscillator circuit of, for example, between 1 to 5 seconds.

The output of the a stable multivibrator is taken at the oscillator of transistor Q1 and is applied through the series connection of diode D5 and resistor R24 to the base of NPN transistor Q6. The collector of transistor Q6 is connected through potentiometer P3 to the collector of transistor Q4, and through diode D12 to the collector of Q3 while the emitter of transistor Q6 is directly connected to the bases of transistors Q3 and Q4. A resistor R23 is connected between the emitter of transistor Q6 and circuit ground. The potentiometer P3 in the collector circuit of transistor Q6 is used only when the testing circuit is in the high voltage ranges and is not used in the lower voltage ranges. The a stable multivibrator and transistors Q3, Q4 and Q6 serve as pulse generating means for interrupting DC current in the circuit being tested.

It will be appreciated from the foregoing that when the device according to the present invention is connected in a DC circuit, a current pulsation at the rate of say 1 to 5 seconds produced by the opening and closing of the relay contacts CR3 and a current pulsation of much higher frequency of say between 140 Hz to 1400 Hz produced by the solid-state switching circuit comprising transistors Q3 and Q4 controlled by the a stable multivibrator is produced on the circuit under test. Therefore switches SW1A, SW1B and relay contacts CR3 provide superimposing means for selectively placing the AC pulse generating means in series with the DC pulse generating means. Obviously, many variations of the specific circuit described will be readily apparent to those skilled in the art. For example, a silicon controlled rectifier or other well known solid-state switching circuit could be substituted in place of transistor Q5 and its associated emitter circuitry. Moreover, it is not necessary to build the entire unit shown in FIG. 1 in order to achieve many of the desirable results of the present invention. For example, if only AC circuits are to be tested, then the DC portion of the circuitry could be omitted. The opposite is also true; however, it should be pointed out that one of the advantages of the total circuit as shown in FIG. 1 is that it is capable of tracing DC circuits in cables both AC and DC circuits, a feature not known before in the prior art. More specifically, if a DC circuit is being tested, then it is necessary to superimpose a relatively high frequency pulsating current in order to be detected by the clamp-on ammeter. If AC circuits are included in the cable, then it may be impossible to distinguish between the currents in those conductors and the conductor under test. This problem, however, is overcome by the present invention by the relatively low frequency pulsing produced by the opening and closing of relay contacts CR3 thereby facilitating the detection of current in the desired conductor.

Figure 2:
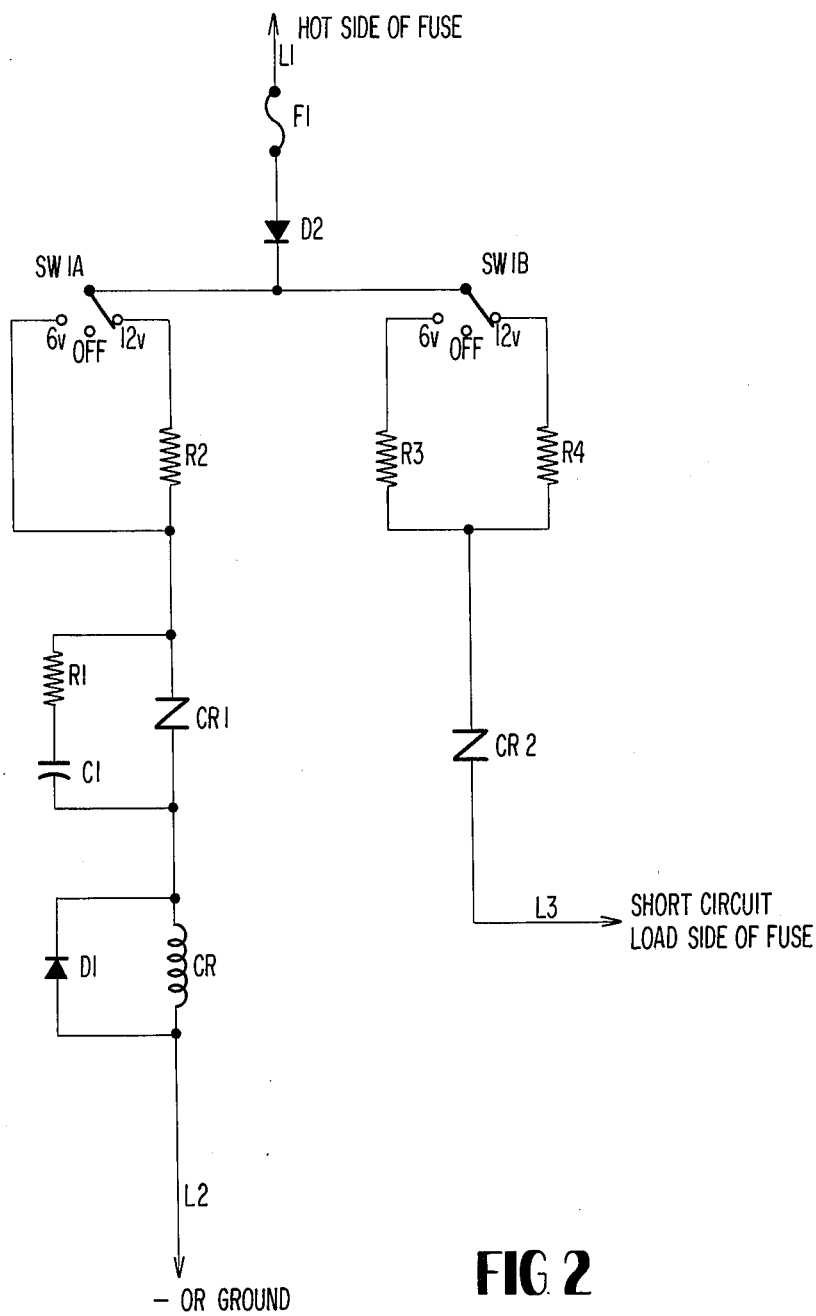
FIG. 2 is a schematic diagram of a testing apparatus for automobile short circuit application using some of the principles of the invention.

In order to illustrate one possible simplification of the testing circuit which is specifically adapted for use in automobile circuits, reference is now made to FIG. 2. This circuit does not require its own power supply but is adapted to be powered by the automobile battery. When switches SW1A and SW1B are in the 12V position, a positive twelve volt potential is applied to both resistors R2 and R4. Resistor R2 is a series limiting resistor approximately equal to the DC resistance of the 6VDC coil of relay CR. Resistor R4 is the series limiting power resistor that applies to a 12VDC circuit under test. Current through the normally closed relay contacts CR1 energizes relay coil CR. This causes contacts CR1 to open, but current continues to flow through coil CR until capacitor C1 charges through resistor R1. As soon as C1 has charged, coil CR is de-energized allowing contacts CR1 to close. Capacitor C1 then discharges through R1 and contacts CR1, and the cycle repeats. This causes relay contacts CR2 to also open and close at a fast rate providing pulsating current to the circuit under test thereby facilitating the tracing of the circuit with a clamp-on ammeter.

Diode D1 serves to collapse the field of relay coil CR when current stop flowing due to the charge on capacitor C1. The fuse F1 and polarized diode D2 serve to protect the testing circuit. Power leads L1 and L2 are connected to the automobile battery terminals, for example, and lead L3 is connected to the load side of the fuse in the circuit under test. R3 is the series limiting resistor of a 6VDC circuit to be tested.

While the circuit shown in FIG. 2 is not as flexible as that shown in FIG. 1, it serves to illustrate how the teachings of the present invention may be applied to a specific application. A particular advantage of the circuit shown in FIG. 2 is its simplicity which permits the test device to be packaged very compactly. For example, in one construction the device was packaged in a cylindrical container approximately six inches long and one half inch in diameter with test leads L1, L2 and L3 emanating from one end of the fuse holder for F1 located in the other end.

It will therefore be apparent that the embodiment shown is only exemplary and that various modifications can be made in construction and arrangement within the scope of the invention as defined in the appended claims.

What is claimed is:

1. An apparatus for locating electrical conductors and short circuits in DC circuits comprising:

first and second tests leads for connecting across fuse terminals or the like in a DC circuit to be tested wherein the fuse is blown by a short circuit or removed;

current limiting means for limiting the DC current in a circuit being tested to a predetermined value to prevent excessive current in a circuit having a short circuit; the predetermined value being sufficiently high such that the DC current when transformed into pulses is discernable at conducting points in the circuit by a clamp-on ammeter;

pulse generating means, connected in series with the current limiting means between the first and second test leads, for intermittently interrupting DC current in the circuit being tested; the frequency and amplitude of the pulses being in the range from 140 to 1400 cycles per second so that a substantially steady current reading is visible on a clamp-on ammeter at all points along the circuit except at the short circuit; the pulse generating means comprising:

solid state switching means connected in series with the current limiting means between the first and second test leads for periodically interrupting the DC current in the circuit being tested; and an adjustable frequency oscillator means connected to the solid state switching means to control the switching rate of the solid state switching means; the adjustable frequency oscillator being an a stable multivibrator and the solid state switching means being polarity-insensitive and comprising:

a first transistor and a first diode, the first diode being connected in series with the collector-emitter circuit of the first transistor to provide a first polarity conduction path; and a second transistor and a second diode, the second diode being connected in series with the collector-emitter circuit of the second transistor to provide a second polarity conduction path; the first transistor and first diode being connected in parallel with the second transistor and second diode; the base of the first and second transistors being connected to the output of the a stable multivibrator.

2. An apparatus for locating electrical conductors and short circuits in AC circuits, in purely DC circuits, and in DC circuits wherein AC circuits are in a common conductor bundle with the DC circuits, comprising:

first and second test leads for connecting across open circuit breaker means in a circuit to be tested wherein the circuit breaker means is open;

first current limiting means for limiting AC current in an AC circuit being tested to a predetermined value to prevent excessive short circuit current in the circuit being tested; the predetermined value being sufficiently high such that the AC current is discernable at conducting points in the circuit by a clamp-on ammeter;

first pulse generating means, connected in series with the first current limiting means between the first and second test leads, for intermittently interrupting the AC current in the circuit being tested; the first pulse generating means providing an on-duration sufficient for a clamp-on ammeter to indicate a momentary pulse, with the off-duration substantially greater than the on-duration;

second current limiting means for limiting the DC current in a DC circuit being tested to a predetermined value to prevent excessive current by short circuit; the predetermined value being sufficiently high such that the DC current when transformed into pulses is discernable at conducting points in the circuit by a clamp-on ammeter;

second pulse generating means, connected in series with the first and second current limiting means between the first and second test leads, for intermittently interrupting the DC current in the circuit being tested; the frequency and amplitude of the pulses being sufficient so that a substantially steady current reading is visible on a clamp-on ammeter at all points along the circuit except at the short circuit;

switch means for selectively connecting the first and second test leads to the series connection of the first current limiting means and the first pulse generating means for testing circuits, and the series connection of the second current limiting means and the second pulse generating means for testing DC circuits; and superimposing means for selectively placing the first pulse generating means in series with the second pulse generating means while testing a DC circuit in a common conductor bundle with AC circuits; whereby periodic pulses and a steady current reading are observable by a clamp-on ammeter at all points along the circuit except at the short circuit, distinguishing the DC circuit tested from steady current readings observable from adjacent AC conductors.

3. The apparatus according to claim 2 wherein the first pulse generating means comprises:

a first set of relay contacts connected in series with the first current limiting means between the first and second test leads, for opening and closing the circuit;

a relay coil adapted to open and close the first set of relay contacts upon energization or deenergization; and relaxation oscillator means for energizing and deenergizing the relay coil at timed intervals.

4. The apparatus according to claim 3 wherein the superimposing means comprises:

a third set of relay contacts connected in series with the second limiting means and the second pulse generating means between the first and second test leads; the third set of relay contacts being opened and closed upon the energization or deenergization of the relay coil.

* * * * *